United States Patent [19]

Pankow

[11] 4,000,471
[45] Dec. 28, 1976

[54] TWT GRID CIRCUIT UTILIZING FEEDBACK

[75] Inventor: Richard J. Pankow, Norwalk, Conn.

[73] Assignee: The United States of America as represented by the Secretary of the Navy, Washington, D.C.

[22] Filed: Oct. 14, 1975

[21] Appl. No.: 621,703

[52] U.S. Cl. .............................. 328/175; 328/209; 330/43
[51] Int. Cl.² .................................. H03K 6/04
[58] Field of Search ............... 328/184, 209, 175; 315/3.5; 331/82; 330/43

[56] References Cited

UNITED STATES PATENTS

| | | | |
|---|---|---|---|
| 3,090,010 | 5/1963 | Zavales | 328/184 |
| 3,165,696 | 1/1965 | Poole | 315/3.5 |
| 3,327,245 | 6/1967 | Britton | 331/82 X |
| 3,566,180 | 2/1971 | Ewton | 315/3.5 |
| 3,737,713 | 6/1973 | Kalish | 315/3.5 |
| 3,796,965 | 3/1974 | Quesinberry et al. | 330/43 |
| 3,936,732 | 2/1976 | Modiano | 330/43 |

Primary Examiner—John S. Heyman
Attorney, Agent, or Firm—R. Sciascia; R. Beers; S. Sheinbein

[57] ABSTRACT

A TWT energizing circuit for compensating for the voltage droop at a TWT cathode comprising the use of a differential amplifier which takes a modulation pulse at one of its inputs and a feedback signal comprising a sample of the body current from the TWT helix at the other of its inputs and applies a signal representative of the difference therebetween to the TWT grid. The above-described feedback circuit forces the grid voltage to track the cathode voltage thus maintaining a constant grid-cathode voltage drop.

10 Claims, 3 Drawing Figures

TWT GRID CIRCUIT UTILIZING FEEDBACK

The present invention relates to energizing circuits for traveling-wave-tubes and, more particularly, to an energizing circuit for compensating for the voltage droop in the T.W.T. cathode experienced during the pulse time of the T.W.T.

STATE OF THE PRIOR ART

As is well known, during the time of response of a traveling wave tube (hereinafter T.W.T.) to an input pulse, a drop in the voltage level is experienced between the body and cathode connections of the T.W.T. This drop is characterized as a "voltage droop"; its effect is to produce variations in the phase and amplitude output characteristics of the T.W.T. In most applications, and particularly in radar transmitters, it is very important that the voltage droop between the T.W.T. body and cathode be kept small during the pulse time in order to maintain low phase and amplitude distortion. The body of the T.W.T. is alternatively known as the shell and occasionally as the anode, as that element is shown and described in Rambo U.S. Pat. No. 3,150,331. Numerous configurations of T.W.T.'s are known in the art and their distinctions from conventional vacuum tubes having envelopes of non-conductive material, e.g., glass, are well recognized. Whereas in conventional vacuum tubes, the envelope is not considered a part of the electrical circuit of the tube, in the case of a T.W.T., the casing, or envelope, or shell may itself be a conductor and is considered as an electrical component, or electrode, of the tube.

In the prior art, a technique for minimizing the droop is to connect an energy storage capacitor between the cathode and the body of the T.W.T., which capacitor is charged from the cathode supply during interpulse intervals, thereby to afford an additional energy source during the pulse time, or pulse intervals. However, for large peak body currents and long pulse times, this technique requires an exessively large capacitor for limiting the voltage droop to an acceptable level.

Typical applications impose limitations on the acceptable physical size of the cathode energy supply capacitor and frequently limit it to a size inadequate to afford the necessary compensation. In addition, the charge storage capability of the capacitor must be selected with due consideration for the amount of energy stored therein such that safety limits are not exceeded in the T.W.T. under arcing conditions. As a result, adequate compensation frequently cannot be provided and thus degradation of the phase and amplitude output characteristics of the T.W.T. must be accepted in the system.

SUMMARY OF THE INVENTION

Briefly, the foregoing defects and limitations of the prior art droop compensation techniques are overcome by the T.W.T. circuit of the present invention. The invention comprises the feeding back a sample of the body current of the T.W.T. to control the input modulation pulse so that its voltage tracks the droop of the cathode charging capacitor. By this means, an extremely flat current pulse is obtained from the T.W.T.

OBJECTS OF THE INVENTION

An object of the present invention is to remove the normally attendant phase and amplitude distortion in radar transmissions due to voltage droop in a T.W.T. circuit.

A further object of the present invention is to essentially eliminate varying current pulses caused by T.W.T. voltage droop.

Other objects, advantages, and novel features of the present invention will become apparent from the following detailed description of the invention when considered in conjunction with the accompanying drawings.

DETAILED DESCRIPTION OF THE INVENTION

Figure 1:
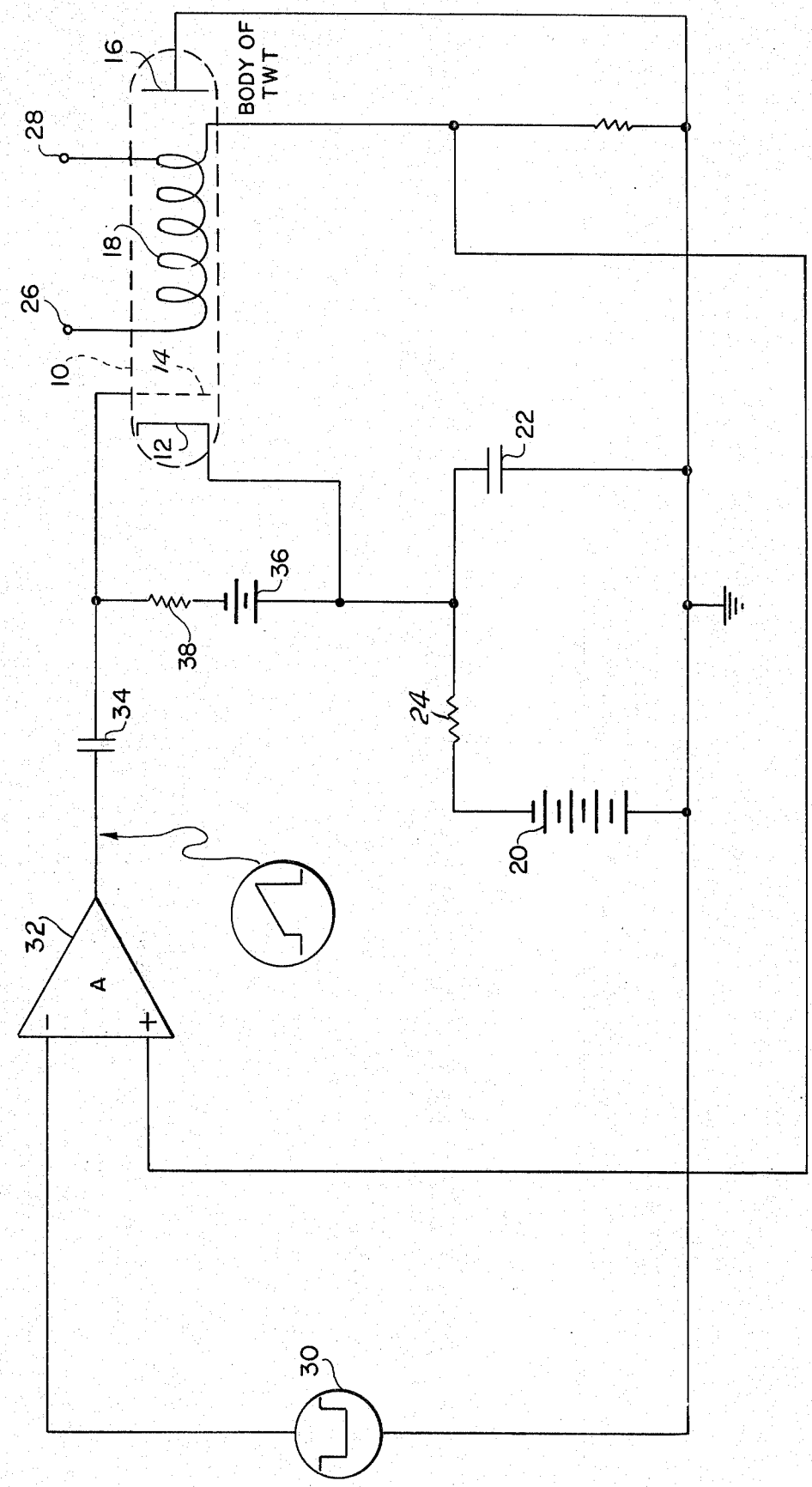
FIG. 1 is a schematic circuit diagram of the T.W.T. energizing circuit of the present invention.

FIG. 1 illustrates a typical traveling wave tube (T.W.T.) 10 having a cathode 12, a grid 14, a collector 16, and an rf input - output helix 18. The cathode 12 is coupled to a highly negative charging circuit comprising a high voltage d.c. source 20, a resistor 24, and a storage capacitor 22. The collector is connected to a fixed voltage source herein illustrated to be ground. The grid 14 of the T.W.T. is biased with respect to the cathode 12 by a direct current source 36 through a resistor 38 to normally maintain the T.W.T. in a cutoff or quiescent state. The r.f. signals to be amplified are connected to the terminal 26 of the helix 18 and the r.f. output is taken from the terminal 28 protruding from the other end of the helix 18 (These connections are typically made by way of a standard shorted quarter-wave stub so that a co-axial cable-to-waveguide coupling is effected). A modulating pulse is coupled to the grid 14 of the T.W.T. by way of a pulse source 30, an amplifier 32, and a d.c. blocking capacitor 34.

In normal operation of the T.W.T. 10, the grid modulator produces a positive pulse on the grid 14 which places the T.W.T. in a conductive state for the duration of the grid pulse thereby causing the r.f. signal propagating through the helix 18 to be amplified. In prior art devices, where a T.W.T. is used in the amplification of r.f. signals, the pulse conduction in the T.W.T. causes a droop in the cathode voltage which produces a phase lag in the r.f. signals in the helix. This voltage droop is illustrated, by way of example, in FIG. 2a for a floating deck circuit floating at −10,000 volts. In order to have the deck float at this voltage the power supplies 20 and 36 must supply −10,000 volts to the cathode and −10,050 volts to the grid. The storage capacitor 22 and the blocking capacitor 34 are thus both charged to approximately −10,000 volts. Upon the arrival at the grid 14 of a +100 volt pulse from the grid modulation source 30 the grid potential rises to −9950 volts causing an electron current to flow from the cathode 12 through the helix 18 to the grounded collector 16. As this electron current is drawn from the cathode 12, the cathode's −10,000 volt potential begins to drop thus discharging the storage capacitor 22. This cathode voltage drop toward positive potential is illustrated by the FIG. 2a wherein the cathode voltage 48 is juxtaposed against a dash-line representation of a constant voltage pulse at the grid. The voltage droop at the cathode is significant because it varies the grid-to-cathode voltage potential which, in turn, varies the shape of the electron current pulse propagating through the helix 18. In the present, example, a voltage droop of only 100 volts or 1 per cent of the floating voltage would cause the tube to cut itself off. The cathode droop can be reduced somewhat by increasing the size of the capacitor 22 but it is generally impractical to make any substantial increase in capacitor size as discussed previously. Yet, a droop of only 50 to 80 volts or 0.5 to 0.8 per cent of the floating potential of −10,000 volts creates a phase change that is intolerable for most r.f. systems, such as radar and the like.

Figure 2B:
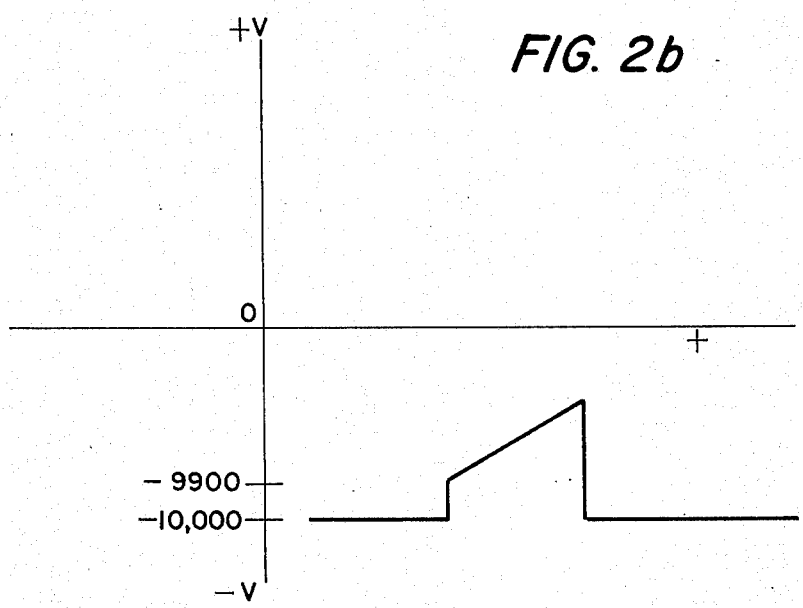
FIG. 2b is a graphical representation of the tracking of the voltage droop at the grid of the T.W.T.
Figure 2A:
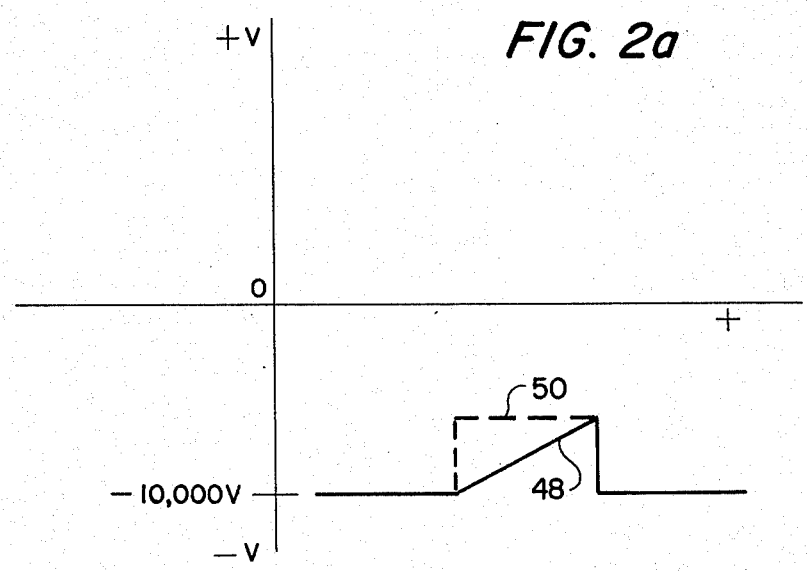
FIG. 2a is a graphical representation of the voltage droop at the cathode of a T.W.T. during pulse time.

The present invention obviates this voltage droop problem by providing a feedback signal from the helix 18 to control the modulation pulse to the grid in accordance with the voltage droop of the cathode 12. This concept is reduced to practice in the present circuit merely by substituting a differential amplifier 32 for the original amplifier 32 and applying the grid modulation pulse from the modulator 30 to the negative terminal of the amplifier 32 and applying a portion of the body current via a line from the helix 18 to the positive terminal of the amplifier 32. The output of the differential amplifier 32 is then the difference between these two signals. This is shown in FIG. 2b wherein the modulation pulse is shown to track the voltage droop of FIG. 2a. As the voltage at the cathode increases, the voltage at the grid increases approximately equally. Thus, the grid-cathode potential difference is maintained approximately constant thereby maintaining the body current approximately flat. The precision with which the grid can be made to track the cathode voltage variation can be made arbitrarily close by merely increasing the loop gain up to the limit of the stability and dynamic range of the amplifier 32.

Although the T.W.T. used to explain the present inventive feedback circuit utilizes a helix as its slow-wave circuit for propagating the radio frequency signals to be amplified down the tube at approximately the velocity of the electron beam, the invention is not limited thereto. A ring bar tube or a coupled cavity tube such as is made by Varian Associates or various other equivalent devices could be used as the slow-wave circuit. Thus the body current samples for the feedback could be taken with equal facility from these devices. The body current sample could even be taken from the body itself if so desired.

Obviously, many modifications and variations of the present invention are possible in light of the above teachings. It is therefore to be understood that, within the scope of the appended claims, the invention may be practiced otherwise than as specifically described.

What is claimed is:

1. A voltage droop compensation circuit for use with a traveling wave tube having a floating grid and cathode, a collector, a body, and a slow-wave circuit for conducting radio frequency signals from an input to an output at approximately the velocity of the electron beam traveling in the tube, the compensation circuit comprising:
   a modulation source for biasing said traveling wave tube into conduction;
   comparison means receiving an input modulation signal from said modulation source at one of its inputs and providing an output signal to said grid;
   charging means for supplying voltage to said cathode; and
   feedback means for conducting a sample of the body current from said slow wave circuit to the other input of said comparison means, said comparison means providing an output signal proportional to the difference between said input modulation signal and said sample of body current so that the voltage on said grid is forced to approximately track the voltage on said cathode.

2. A voltage droop compensation circuit as defined in claim 1, wherein said comparison means comprises a differential amplifier.

3. A voltage droop compensation circuit for a traveling wave tube having a grid, a cathode, and a body, said circuit comprising:
   a modulation source for biasing said traveling wave tube into conduction;
   comparison means for receiving a modulation signal from said modulation source at one of its inputs and providing an output signal to said grid; and
   feedback means for conducting a sample of the body current of said traveling wave tube to the other input of said comparison means, said comparison means providing an output proportional to the difference between said modulation signal and said body current sample.

4. A voltage droop compensation circuit as defined in claim 2 wherein said input modulation signal is coupled to a negative input terminal of said differential amplifier and said sample of body current signal is coupled to a positive input terminal of said differential amplifier.

5. A voltage droop compensation circuit as defined by claim 4 further comprising a grid control circuit coupled between the output of said differential amplifier and the grid of said traveling wave tube to bias said traveling wave tube into a quiescent state at times when no modulation signal is being received from said modulation source.

6. A voltage droop compensation circuit as defined in claim 4 wherein said modulation source is a pulse source.

7. A voltage droop compensation circuit is defined in claim 3, wherein said comparison means comprises a differential amplifier.

8. A voltage droop compensation circuit as defined in claim 7 wherein said input modulation signal is coupled to a negative input terminal of said differential amplifier and said sample of body current signal is coupled to a positive input terminal of said differential amplifier.

9. A voltage droop compensation circuit as defined by claim 8 further comprising a grid control circuit coupled between the output of said differential amplifier and the grid of said traveling wave tube to bias said traveling wave tube into a quiescent state at times when no modulation signal is being received from said modulation source.

10. A voltage droop compensation circuit as defined in claim 8 wherein said modulation source is a pulse source.

* * * * *